United States Patent [19]

Sengupta et al.

[11] Patent Number: 5,846,893
[45] Date of Patent: *Dec. 8, 1998

[54] THIN FILM FERROELECTRIC COMPOSITES AND METHOD OF MAKING

[76] Inventors: Somnath Sengupta; Louise Sengupta, both of 12 New Haven Blvd., Warwick, Md. 21912

[ * ] Notice: The term of this patent shall not extend beyond the expiration date of Pat. No. 5,635,434.

[21] Appl. No.: 569,470

[22] Filed: Dec. 8, 1995

[51] Int. Cl.$^6$ ..................................................... C04B 35/46
[52] U.S. Cl. ........................................... 501/137; 501/121
[58] Field of Search .................................... 501/137, 108, 501/119, 121

[56] References Cited

U.S. PATENT DOCUMENTS

| | | | |
|---|---|---|---|
| 4,987,107 | 1/1991 | Narumi et al. | 501/137 |
| 5,312,790 | 5/1994 | Sengupta et al. | 501/137 |
| 5,427,988 | 6/1995 | Sengupta et al. | 501/137 |
| 5,486,491 | 1/1996 | Sengupta et al. | 501/137 |
| 5,635,433 | 6/1997 | Sengupta | 501/137 |
| 5,635,434 | 6/1997 | Sengupta | 501/137 |

FOREIGN PATENT DOCUMENTS 47-17062  4/1972  Japan ..................................... 501/137

*Primary Examiner*—Deborah Jones
*Attorney, Agent, or Firm*—Paul S. Clohan; U. John Biffoni

[57] ABSTRACT

A thin film composite material comprises barium strontium titanate represented as $Ba_{1-x}Sr_xTiO_3$ wherein x is greater than 0.0 but less than or equal to 0.75 and a magnesia-based compound such as $MgZrO_3$, $MgTiO_3$, $MgAl_2O_4$ and mixtures thereof. The thin film ferroelectric composite is made using pulsed laser deposition and exhibits high tunability, low loss and a low dielectric constant.

13 Claims, 2 Drawing Sheets

CAPACITANCE VS VOLTAGE CHARACTERISTICS
OF BSTO/ 1wt% SPINEL FILM.

CAPACITANCE VS VOLTAGE CHARACTERISTICS
OF BSTO/ 1wt% $MgZrSrTiO_3$ FILM.

CAPACITANCE VS VOLTAGE CHARACTERISTICS
OF BSTO/ 1wt% MZrO$_3$ FILM.

CAPACITANCE VS VOLTAGE CHARACTERISTICS
OF BSTO/ 1wt% MgTiO$_3$ FILM.

THIN FILM FERROELECTRIC COMPOSITES AND METHOD OF MAKING

FIELD OF THE INVENTION

The present invention is directed to thin film ferroelectric composites and a method of making and, in particular, to barium strontium titanate and magnesia-based compounds formed by pulse laser deposition.

BACKGROUND OF THE INVENTION

This patent application incorporates the materials cited in U.S. Patent Application entitled "Novel Ceramic Ferroelectric Material" (Ser. No. 08/076,291 issued on May 17, 1993, U.S. Pat. No. 5,312,790), "Novel Ceramic Ferroelectric Composite Material—BSTO—$ZrO_2$" (Ser. No. 08/207,447), "Novel Ceramic Ferroelectric Composite Material— BSTO—MgO" (Ser. No. 08/207,446). These patent applications are commonly owned by the U.S. Government as represented by the Secretary of the Army. The invention described herein may be manufactured, used and licensed by or for the U.S. Government without payment there to of any royalty thereon.

Barium strontium titanate ($BaTiO_3$—$SrTiO_3$), also referred to herein as BSTO, has been known to be used for its high dielectric constant (approximate range from 200 to 6,000) in various antenna applications. This is set forth by Richard W. Babbitt et al. in their publication, "Planar Microwave Electro-Optic Phase Shifters," Microwave Journal, Volume 35 (6), (June 1992). This publication concludes that there exists a need for additional research to be conducted in the materials art to yield materials having more desirable electronic properties.

Although various types of ferroelectric composite materials are known, prior art methods of making are not conducive to the use of these types of material in ferroelectric phase shifter applications at high frequencies, e.g., 30 GHz and upwards. In these applications, it is desirable to have the ferroelectric material in a thickness of 1 micron or less. It is difficult to polish ceramics of these thicknesses and at the same time handle them properly for insertion into a given device.

As such, a need has developed for the fabrication of thin film materials having improved electronic properties which may have ideal properties with use, for example, in multi-layer capacitors, capacitor-varistors and non-volatile computer memory or for use in phased array antenna systems.

There is also a need in the multilayer ceramic capacitor market for the ability to fabricate these types of ferroelectric materials in forms that may assist in increasing the component density of the circuit. There is a growing need for miniaturization, large capacitance and low cost in this market.

In response to this need, the present invention solves the problem of fabricating these types of materials for application in miniaturized devices or in a form not requiring polishing. According to the invention, thin film ferroelectric materials can be fabricated having enhanced electronic properties.

SUMMARY OF THE INVENTION

Accordingly, it is an object of the present invention to provide a ferroelectric material suitable for, but not limited to, use in phased array antenna systems.

It is a further object of the present invention to fabricate a material exhibiting enhanced electronic properties.

It is still a further object of the present invention to provide a ferroelectric material having a moderate dielectric constant, a low loss and a high tunability.

Another object of the present invention to provide materials having electronic properties, wherein said electronic properties can be adjusted in such a manner that they can be employed in any discrete element phase shifter design.

It is a further object of the present invention to provide a ferroelectric material which is easily machinable.

Still, it is a further object herein to provide a ferroelectric material which possesses superior electronic properties at dc, microwave and millimeter wave operating frequencies.

Other objects and advantages of the present invention will become apparent as a description thereof proceeds.

In satisfaction of the foregoing objects and advantages, the present invention provides a novel thin film ferroelectric composite material comprising barium strontium titanate, said barium strontium titanate represented as $Ba_{1-x}S_xTiO_3$, wherein x is greater than 0.0 but less than or equal to 0.75; and a magnesia-based compound: wherein the barium strontium titanate and the magnesia-based compounds are present in effective amounts to provide a composite having a low dielectric constant, low loss tangent and high tunability.

More preferably, the magnesia-based compound ranges between 1 and 60% by weight of the composite material with the barium strontium titanate occupying the balance.

In another aspect of the invention, the thin film ferroelectric composite material can be made using pulsed laser deposition to form the composite material identified above. In this method, a ceramic disc of the ferroelectric composition is provided as an ablation target. A substrate is provided and a thin film of the composition is deposited on the substrate using a pulsed laser.

Preferably, the laser is a pulsed eximer laser utilizing a laser wavelength of 248 nm, a laser pulse energy of 220 mJ/pulse, a pulse with a 20 ns and a pulse repetition rate of 10 Hz.

BRIEF DESCRIPTION OF THE DRAWINGS

Reference is now made to the drawings of the invention wherein.

DESCRIPTION OF THE PREFERRED EMBODIMENTS

Figure 1:
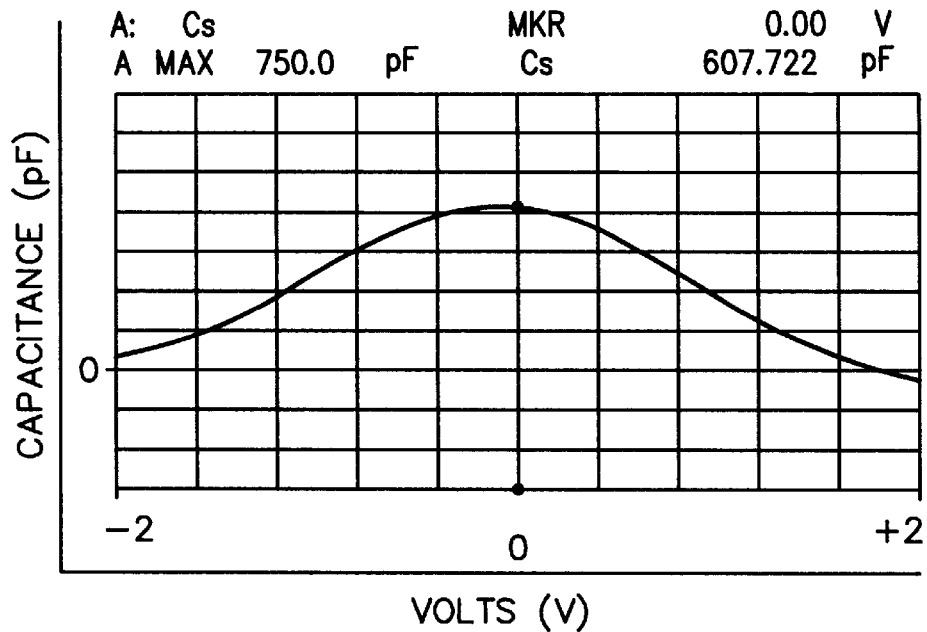
FIG. 1 plots capacitance vs. voltage for a thin film of barium strontium titanate with 1 weight % of a spinel.

The subject matter of the present invention relates to the fabrication of specific ceramic materials (either bulk ceramic or pulsed laser deposited (PLD) thin films) which have sought after properties in, for example, phased array antenna systems. The sought after properties include (1) a moderate dielectric constant; (2) a low loss; and (3) high tunability. Dielectric constant is related to the energy storage in the material; whereas, the loss tangent is related to the power dissipation in the same material. In general, the dielectric function is a complex quantity with $\epsilon = \epsilon' - i\epsilon''$; and the loss tangent, $\tan \delta = \epsilon''/\epsilon' = 0.001$ or less where $\epsilon'$ is the real part of the dielectric constant and $\epsilon''$ is the imaginary part of the dielectric constant.

Tunability may be defined as ((dielectric constant with no applied voltage)—(dielectric constant with an applied voltage))/(dielectric constant with no applied voltage). For simplicity purposes, tunability can be represented as $$T = \left( \frac{X - Y}{X} \right)$$

wherein, T is % tunability,
X=(dielectric constant with no applied voltage)
Y=(dielectric constant with an applied voltage).

The tunability of a material under an electric field of 2.0 V/micron can range from 1–60% depending upon the composition of the materials employed.

The materials herein combine barium strontium titanate ($BaTiO_3$—$SrTiO_3$) with any magnesia-based oxide. These bulk ceramic materials, encompassed by the present invention, are superior in that they are homogeneous, extremely dense, easily machinable, and possess superior electronic properties at both dc and microwave operating frequencies. Moreover, the ceramics herein have low water absorptivity. Typically these materials will absorb less than 2% by weight of liquid therein. Hence, the materials within the scope of the present invention are environmentally stable, for example, they have good moisture and temperature stability.

Although other combinations of electrically active and inactive components have been commonly employed in conjunction with piezoelectric materials, nowhere has the combination of the present invention been described by others. More specifically, the present invention is the first teaching wherein BSTO is combined with magnesia compounds in thin film form in order to adjust the electronic properties and phase shifting ability of a material. Specifically, nowhere has BSTO been combined with these magnesia compounds to adjust the electronic properties of the material for use in a phase array antenna system. Aside from the combination of BSTO with magnesia compounds being novel, its application in phased array antenna systems is an application never suggested in the prior art.

Replacing the currently employed materials with the novel ferroelectric composite described in the present invention will improve the overall performance of a phased array antenna system as well as reduce the cost, weight and size of the antenna per se.

The present invention encompasses the fabrication of novel ceramic materials having enhanced electronic properties. These materials are superior to other currently employed ferroelectric materials.

When one considers the optimization in the electronic properties of ceramic materials, the following parameters must be taken into consideration:

(1) Dielectric Constant: Ideally the dielectric constant should be in the range from approximately 30 to 2500. The lower dielectric constants are preferable since the impedance matching for these becomes easier. The low dielectric constants (around 50–200) do not decrease the phase shifting ability of the material if a sufficient length of material is used (then a high dielectric constant is not needed). Also, as insertion loss (loss of energy getting into the ceramic) does not depend upon the dielectric constant, it is not affected by lowering the dielectric constant. Since the loss tangent (tan δ) increases with increasing dielectric constant (for these ferroelectric materials), lower dielectric materials tend to have lower loss tangents and therefore, less insertion loss. However, even composites of BSTO—MgO, BSTO—$MgZrSrTiO_3$, BSTO—$MgZrO_3$, BSTO—$MgTiO_3$ wherein $Ba_{(1-x)}$=0.60, that have higher dielectric constants (above approximately 800) have low loss (less than 0.003).

(2) Low Loss: The loss tangent (intrinsic to the material) serves to dissipate or absorb the incident microwave energy and therefore is most effective in this device when the loss tangent is in the range of 0.001 or less. The low loss tangent serves to decrease the insertion loss and hence increase the phase shifter per decibel of loss. The operating frequency is controlled by the loss tangent. Extremely low loss materials (0.0007) can be used at millimeter wave range frequencies.

(3) High Tunability: The tunability of a particular material affects the material's electronic properties by how much the dielectric constant changes with applied voltage. The amount of phase shifting ability is directly related to the tunability; therefore, higher tunabilities are desired. The tunability can be increased to some extent by decreasing the sample thickness. The insertion loss is inversely related to the tunability so that the larger the tunability, the smaller the insertion loss. Optimum electronic properties would have tunabilities ranging from 4 to 50% (depending upon other factors, dielectric constant and loss tangent).

The materials within the scope of the present invention fall within the optimum characteristics outlined above. These materials are $Ba_{1-x}Sr_xTiO_3$—MgO, BSTO—$MgZrSrTiO_3$, BSTO—$MgZrO_3$, BSTO—$MgAl_2O_4$, and BSTO—$MgTiO_3$ wherein x is greater than 0.0 but less than or equal to 0.75. These formulations may be referred to as barium strontium titanate and magnesia-based compounds. The weight ratios of barium strontium titanate (BSTO) to the magnesia compounds may range from 99% wt.–40% wt. BSTO to 1% wt.–60% wt. MgO, $MgZrSrTiO_3$, $MgZrO_3$, $MgAl_2O_4$ or $MgTiO_3$. A typical composition within the present invention may comprise 99% by weight BSTO (wherein x =0.40) and 1% by weight MgO, 1 wt % $MgZrSrTiO_3$, 1 wt % $MgZrO_3$, 1 wt % $MgAl_2O_4$ or BSTO—$MgTiO_3$. BSTO-1 wt % MgO has a dielectric constant of about 400, and a tunability of around 22% (applied electric field—3 V/micron). BSTO-1 wt % $MgZrO_3$ has a dielectric constant of 1216 and a tunability of 48% (applied electric field—7 V/micron). BSTO-1 wt % $MgZrSrTiO_3$ has a dielectric constant of 745 and a tunability of 20% (applied electric field=3 V/micron). BSTO-1 wt % $MgAl_2O_4$ has a dielectric constant of 858 and a tunability of 14% (applied field=3 V/micron). BSTO $MgTiO_3$ has a dielectric constant of 1150, and a tunability of 12% (applied field—3.00 V/micron).

Magnesia and/or magnesia based compounds are used herein to adjust the electronic properties of BSTO. These compounds, even at low doping levels (1–10% wt.) can be used to adjust the dielectric properties in any discrete element phase shifter design, such as planar microstrip, waveguide geometries or for use in a parallel plate structure. It has been found that the electronic properties of BSTO-magnesia are reproducible to within 5%. Hence, once a specific formulation of BSTO-magnesia is determined to be suitable for a specific purpose, the composition can be reproduced within 5% accuracy.

The preparation of BSTO-magnesia thin films may be accomplished by preparing a ceramic disc of the appropriate composition for subsequent use of that disc as the ablation target for depositing the thin film onto the desired substrate under the proper deposition conditions utilizing the pulsed laser deposition method. If the antenna application does not require exceedingly high tunability (where tunability can be increased with a decrease in sample thickness for a given externally applied electric field), then the compositions with lower dielectric constants are probably likely to produce less impedance mismatch and may possess lower loss tangents.

EXAMPLE 1

This example will describe a typical thin film deposition procedure. The single crystal substrates (obtained commercially) are cleaned in trichloroethylenes, followed by two rinses with isopropyl alcohol. Following the degreasing, the substrates are air dried. The substrate and the target are then mounted in the vacuum deposition chamber. Table I lists the laser characteristics used for the experiments.

Table I

Laser—pulsed excimer laser

Wavelength: 248 nm

Pulse energy: 250 mJ/pulse

Pulse width: 20 ns

Pulse repetition rate: 10 Hz

Table II illustrates the thin film deposition conditions.

Table II

Substrate temperature: 450° C.

Substrate to target distance: 50 mm

Oxygen backfill pressure: 100 mT

Under the above-mentioned conditions, the typical deposition rate was about 0.2 Å/pulse. After the films were deposited, they were investigated through glancing angle x-ray diffraction in order to confirm their orientation and composition. The results indicated that the films are stoichiometrically similar to the ablation target. The nominal thickness of the films were determined to be about 3000 Å. The thicknesses were measured by a profilometer. All the films in this study had Pt top electrodes. It should be understood that Example I is exemplary and not limiting to the inventive method or processing variables.

Preferred ranges for the variables used in the example include:

Wavelength: 193 nm–248 nm

Pulse energy: 200 mJ/pulse to 350 mJ/pulse

Pulse width: 10 ns–20 ns

Pulse repetition rate: 5 Hz–25 Hz

Substrate temperature: 400° C.–700° C.

Substrate to target distance: 25 mm–50 mm

Oxygen backfill pressure: 50 mT–100 mT.

Electronic Measurements

The electronic characterization of the films were performed by measuring the capacitance vs. voltage (C-V) characteristics of the films at 0.5 MHz with a HP 4194 A Impedance analyzer. FIG. 1, shows the capacitance versus voltage characteristics for the BSTO/1 wt % spinel film deposited on $RuO_2$/Sapphire substrate. The dielectric constant at zero bias was calculated to be 858 and the tunability if 14% at a field of 3 V/$\mu$m. Any porosity and/or leakage current in the films will tend to affect the dielectric constants obtained.

Figure 2:
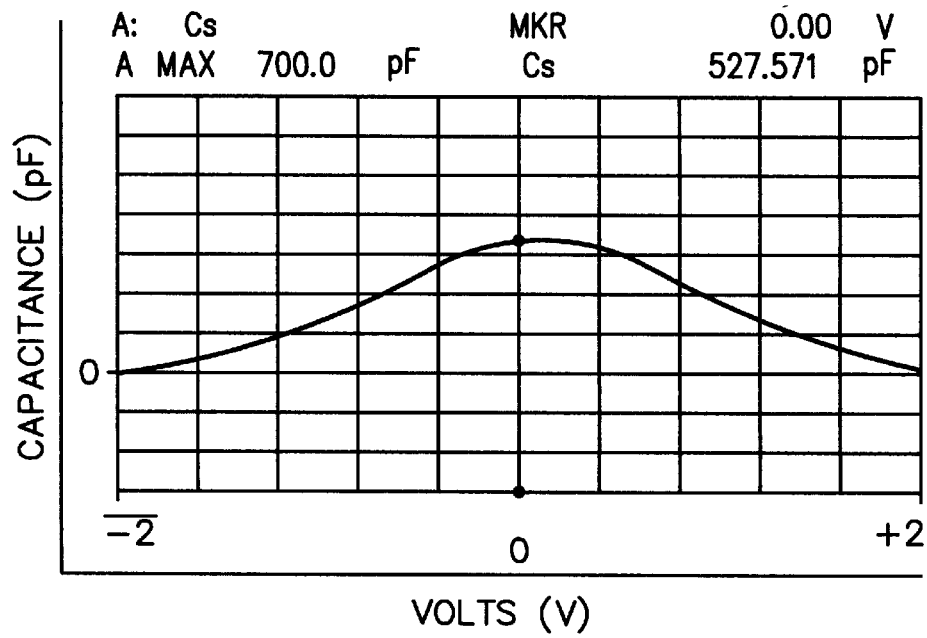
FIG. 2 plots capacitance vs. voltage for a thin film of barium strontium titanate with 1 weight % $MgZrSrTiO_3$.

The C-V curve for the BSTO/1 wt % MZST thin film deposited on $RuO_2$/Sapphire substrate is shown in FIG. 2. The curve shows a typical paraelectric behavior, (i.e. a symmetric capacitance), with positive and negative bias applied. The dielectric constant at zero voltage calculated from this curve is 745. The tunability obtained was 20at an applied bias of 3 V/$\mu$m.

Figure 3:
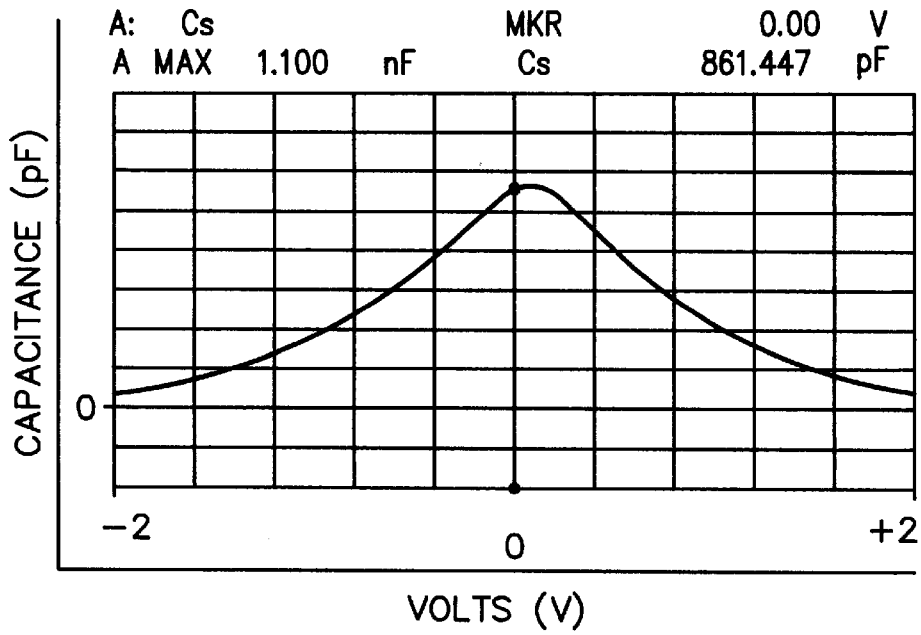
FIG. 3 plots capacitance vs. voltage for a thin film of barium strontium titanate with 1 weight % $MgZrO_3$.

The capacitance versus voltage for the BSTO/1 wt % $MZrO_3$ thin film deposited on $RuO_2$/sapphire substrate is shown in FIG. 3. This curve also shows the typical paraelectric behavior of symmetric capacitance versus voltage behavior. The value for the zero voltage dielectric constant is 1216 and the tunability is 48% a5 7 V/$\mu$m.

Figure 4:
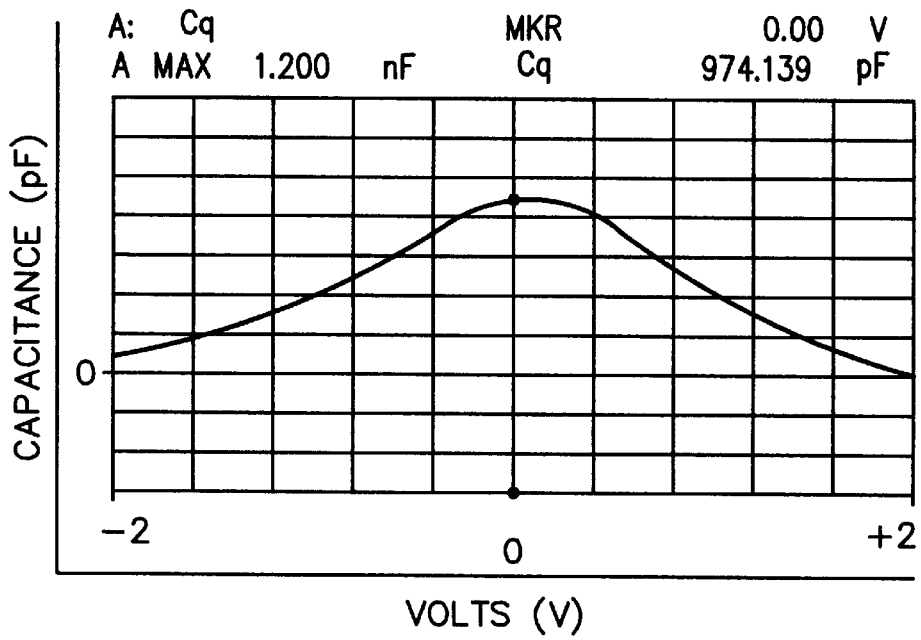
FIG. 4 plots capacitance vs. voltage for a thin film of barium strontium titanate with 1 weight % $MgTiO_3$.

The C-V curve for the BSTO/1 wt % $MgTiO_3$ thin film deposited on $RuO_2$/Sapphire substrate is shown in FIG. 4. The curve shows a typical paraelectric behavior, (i.e. a symmetric capacitance), with positive and negative bias applied. The dielectric constant at zero voltage calculated from this curve is 1150. The tunability obtained was 12% at an applied bias of 3 V/$\mu$m.

While particular embodiments of the present invention have been shown and described, it will be obvious to those skilled in the art that changes and modifications may be made without departing from this invention. For example, the invention may be modified to include thin film composites of BSTO and other low dielectric constant materials depending upon the particular requirements of the intended application. Among some of the other low dielectric constant materials which may be combined with BSTO are combinations of these magnesia, zirconia and alumina compounds in separate dopant levels or in composite form, silicon dioxide and other low dielectric constant, low dielectric loss oxides. Furthermore, two or more of these oxides may be co-ablated to form specific combinations of compositions in order to tailor the properties of these thin films depending upon the requirement.

It is, therefore, intended that the claims herein are to include all such obvious changes and modifications as fall within the true spirit and scope of this invention.

We claim:

1. A thin film ferroelectric composite material comprising:
    barium strontium titanate, said barium strontium titanate represented as $Ba_{1-x}Sr_xTiO_3$, wherein x is greater then 0.0 but less than or equal to 0.75; and a magnesia-based compound:
        wherein the weight ratio of said barium strontium titanate and said magnesia based compound ranges from approximately 99%–40% barium strontium titanate to approximately 1%–60% magnesia based compound in effective amounts to provide a composite having a low dielectric constant, low loss tangent and high tunability.

2. The thin film ferroelectric composite material of claim 1, wherein said barium strontium titanate is $Ba_{1-x}Sr_xTiO_3$, wherein x=0.35 to 0.40.

3. The thin film composite material of claim 1, wherein said magnesia based compound is selected from the group consisting of $MgZrO_3$, $MgTiO_3$, $MgAl_2O_4$, mixtures thereof.

4. The thin film of claim 3, wherein said compound is $MgTiO_3$.

5. The thin film of claim 3, wherein said compound is $MgZrO_3$.

6. The thin film of claim 3, wherein said compound is $MgAl_2O_4$.

7. A method of making a thin film ferroelectric composite material comprising the steps of:
    a) providing at least one ceramic disc as an oblation target of a composition comprising barium strontium titanate, said barium strontium titanate represented as $Ba_{1-x}Sr_xTiO_3$, wherein x is greater than 0.0 but less than or equal to 0.75; and a magnesia based compound, wherein the weight ratio of said barium strontium titanate and to said magnesia-based compounds ranges from 99–40% barium strontium titanate to approximately 1–60% magnesia based compounds (are present) in an effective amount to provide a composite having a low dielectric constant, low loss tangent and a high tunability b) providing a substrate; and c) depositing a thin film of said composition on said substrate using a pulsed laser.

8. The method of claim 7 wherein said magnesia based compound is selected from the group consisting of $MgZrO_3$, $MgTiO_3$, $MgAl_2O_4$ and mixtures thereof.

9. The method of claim 8, wherein said compound is $MgTiO_3$.

10. The method of claim 8, wherein said compound is $MgZrO_3$.

11. The method of claim 8, wherein said compound is $MgAl_2O_4$.

12. The method of claim 7 wherein said pulsed laser is a krypton fluoride excimer laser.

13. The method of claim 8 wherein said substrate is at a temperature of 450° C. and a distance between the substrate and target is 50 mm.

* * * * *